United States Patent
Yamagata et al.

[11] Patent Number: 6,156,624
[45] Date of Patent: *Dec. 5, 2000

[54] METHOD FOR PRODUCTION OF SOI SUBSTRATE BY PASTING AND SOI SUBSTRATE

[75] Inventors: Kenji Yamagata, Sagamihara; Takao Yonehara, Atsugi; Tadashi Atoji, Machida; Kiyofumi Sakaguchi, Yokohama, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/832,859

[22] Filed: Apr. 4, 1997

[30] Foreign Application Priority Data

Apr. 8, 1996 [JP] Japan ................... 8-085187
Mar. 31, 1997 [JP] Japan ................... 9-079783

[51] Int. Cl.$^7$ ................................... H01L 21/306
[52] U.S. Cl. ................ 438/459; 438/406; 438/753; 438/977; 428/446; 428/450; 428/702
[58] Field of Search ................... 428/428, 446, 428/447, 448, 450, 702; 438/478, 479, 118, 311, 406, 409, 459, 525, 753, 960, 977; 257/288, 347, 352

[56] References Cited

U.S. PATENT DOCUMENTS

| | | | |
|---|---|---|---|
| 5,250,460 | 10/1993 | Yamagata et al. | 437/62 |
| 5,405,802 | 4/1995 | Yamagata et al. | 437/71 |
| 5,498,893 | 3/1996 | Usui et al. | 257/347 |
| 5,523,254 | 6/1996 | Satoh et al. | 437/62 |
| 5,523,602 | 6/1996 | Horiuchi et al. | 257/347 |
| 5,580,797 | 12/1996 | Miwa et al. | 437/32 |
| 5,616,507 | 4/1997 | Nakai et al. | 438/480 |
| 5,670,411 | 9/1997 | Yonehara et al. | 437/62 |
| 5,679,475 | 10/1997 | Yamagata et al. | 428/698 |
| 5,691,231 | 11/1997 | Kobayashi et al. | 437/62 |
| 5,695,557 | 12/1997 | Yamagata et al. | 117/97 |
| 5,705,421 | 1/1998 | Matsushita et al. | 437/62 |

FOREIGN PATENT DOCUMENTS

| | | |
|---|---|---|
| 0 476 897 | 3/1992 | European Pat. Off. . |
| 0 488 147 | 6/1992 | European Pat. Off. . |
| 0 588 280 | 3/1994 | European Pat. Off. . |
| 0 603 849 | 6/1994 | European Pat. Off. . |
| 0603849 | 6/1994 | European Pat. Off. . |
| 0663688 | 7/1995 | European Pat. Off. . |
| 0 676 796 | 10/1995 | European Pat. Off. . |
| 59-031990 | 2/1984 | Japan . |
| 59-087481 | 5/1984 | Japan . |
| 3-087895 | 4/1991 | Japan . |
| 3-171188 | 7/1991 | Japan . |
| 4-079209 | 3/1992 | Japan . |
| 4-133087 | 5/1992 | Japan . |
| 4-182684 | 6/1992 | Japan . |
| 4-190385 | 7/1992 | Japan . |
| 4-234066 | 8/1992 | Japan . |
| 5-021765 | 6/1993 | Japan . |
| 5-188796 | 7/1993 | Japan . |
| 5-217822 | 8/1993 | Japan . |

OTHER PUBLICATIONS

Patent Abstracts of Japan, vol. 16, No. 297 (E–1226), Jun. 30, 1992 (corresponding to JP 4–79209).

(List continued on next page.)

Primary Examiner—Timothy Speer
Assistant Examiner—Stephen Stein
Attorney, Agent, or Firm—Fitzpatrick, Cella, Harper & Scinto

[57] ABSTRACT

This invention solves the problem of a pasted SOI substrate generating voids in the peripheral part thereof and consequently decreasing the number of devices to be derived therefrom. It concerns a method for the production of a SOI substrate obtained by pasting a first Si substrate possessing a $SiO_2$ surface and a second substrate possessing a Si surface on the $SiO_2$ surface and the Si surface, which method comprises washing the Si surface of the second Si substrate, thereby imparting hydrophobicity to the Si surface before the first Si substrate and the second Si substrate are pasted together.

48 Claims, 5 Drawing Sheets

OTHER PUBLICATIONS

Patent Abstracts of Japan, vol. 016, No. 516 (P–1443), Oct. 23, 1992 (JP 04–190385).
Patent Abstracts of Japan, vol. 008, No. 202 (P–300), Sep. 14, 1984 (JP 59–087481).
Patent Abstract of Japan, vol. 016, No. 402 (P–1409), Aug. 25, 1992 (JP 04–133087).
Patent Abstracts of Japan, vol. 008, No. 129 (P–280), Jun. 15, 1984 (JP 59–031990).
Patent Abstracts of Japan, vol. 015, No. 266 (P–1223), Jul. 5, 1991 (JP 03–087895).
Patent Abstracts of Japan, vol. 016, No. 586 (P–1463), Dec. 25, 1992 (JP 04–234066).
Patent Abstracts of Japan, vol. 016, No. 502 (P–1438), Oct. 16, 1992 (JP 04–182684).
Patent Abstracts of Japan, vol. 017, No. 611 (P–1641), Nov. 10, 1993 (JP 05–188796).
Patent Abstracts of Japan, vol. 015, No. 420 (P–1267), Oct. 24, 1991 (JP 03–171188).
Patent Abstracts of Japan, vol. 016, No. 297 (E–1226), Jun. 30, 1992 (JP 04–079209).
Patent Abstracts of Japan, vol. 017, No. 295 (E–1377), Jun. 7, 1993 (JP 05–021765).
Patent Abstracts of Japan, vol. 017, No. 653 (E–1469), Dec. 3, 1993 (JP 05–217822).
T. Abe, "Silicon Wafer Bonding Mechanism for Silicon–On–Insulator Structures", Jap. J. of App. Phys., vol. 29, No. 12, part 2, Dec. 1, 1990.
N. Sato, "High–Quality Epitaxial Layer Transfer (Eltran) By bond and Etch–Back of Porous Si", 1995 IEEE Intl. SOI Conf. Proc., Tucson, Oct. 3–5, 1995.
H. Ohashi, "Improved Dielectrically Isolated Device Integration By Silicon–Wafer Direct Bonding (SDB) Technique", IEDM, Tech. Dig., Los Angeles, Dec. 7–10, 1986.
Proceedings of 4th International Symposium an Silicon–On–Insulator Technology and Devices, May 6–11, 1990, T. Abe et al., "Silicon Wafer–Bonding Process Technology for SOI Structures".
Japanese Journal of Applied Physics, vol. 30, No. 4, Apr., 1991, pp. 615–622, K. Mitani et al., "Causes and Prevention of Temperature–Dependent Bubbles in Silicon Wafer Bonding".

METHOD FOR PRODUCTION OF SOI SUBSTRATE BY PASTING AND SOI SUBSTRATE

BACKGROUND OF THE INVENTION

1. Field of the Invention

This invention relates to a method for producing a pasted SOI substrate and to an SOI substrate and more particularly to a method for producing of a pasted SOI substrate which has repressed voids liable to occur particularly in the most peripheral part thereof, widened the area thereof available for the manufacture of devices, increased the number of devices derivable therefrom, and improved the yield and quality of the SOI substrate.

2. Related Background Art

The formation of a single crystal Si semiconductor layer on an insulator is widely known as the "silicon on insulator (SOI)" technique. Many studies have been made on this substrate because the substrate possesses numerous excellent characteristics which are not exhibited by standard bulk Si substrates for the manufacture of Si integrated circuits.

In recently reported SOI structures, the so-called "pasted SOI" stands out particularly in terms of quality. This pasted SOI is the product of a technique which comprises preparing two wafers at least either of which has an insulating film formed by oxidation, tightly joining the two wafers on the mirror faces thereof, heat-treating the joined wafers thereby fortifying the bond at the tight interface, and then polishing or etching either of the substrates of the joined wafers until a Si single crystal thin film of an arbitrary thickness remains on the insulating film.

Many studies have been made concerning the mechanism of the pasting which constitutes the backbone of this technique. The method for cleaning the two substrates before they are pasted to each other is considered one of the important issues in these studies. Scientists have ascertained that the two substrates are first given weak bondage by the Van der Waals force during their contact at room temperature and then given strong interatomic bondage by a subsequent heat-treatment at an elevated temperature. The strength of this Van der Waals bondage varies widely depending on the method used for cleaning the substrates. In Proceedings of 4th International Symposium on Silicon-on-Insulator Technology and Devices, May 6–11, 1990, Montreal, for example, Abe et al., regarding the pasting of Si and $SiO_2$, report "that while the wafers cleaned with a HF solution are bonded only with great difficulty, the wafers which have undergone the so-called "RCA cleaning" are bonded easily because they have formed a spontaneous oxide film on their surfaces". Many other researchers assert that the water adsorbed to the interface of the pasted substrates plays an important role in the bondage by the Van der Waals force and, therefore, the silicon surfaces are required to be hydrophilic. In Japanese Journal of Applied Physics, vol. 30, no. 4, April 1991, pp. 615, Mitani et al. report "that the wafer surfaces cleaned by the HF dipping generate more bubbles in the range of annealing temperatures of 200° C.–800° C. than the wafer surfaces cleaned by the dipping in $NH_4OH+H_2O_2$, notwithstanding the former wafer surfaces are inferred to have less —OH groups than the latter wafer surfaces".

It has been consequently held generally that when Si and $SiO_2$ are pasted, perfect bonding cannot be obtained unless at least the Si side has undergone a treatment to impart hydrophilicity.

The present inventors, in their experiment which comprises pasting a Si wafer treated to acquire hydrophilicity and a Si wafer provided with an oxide film and heat-treating the pasted wafers, have found that voids considered to have originated in bubbles occur at a high density in the peripheral part of the substrate (in an annular area within about 3 mm–4 mm from the wafer edge) (hereinafter referred to as "peripheral voids"). The group of voids leads to a possible decrease in the area available for the formation of devices and, at the same time, may cause exfoliated fragments of films to adhere to the water surfaces, thereby hindering the device manufacturing process.

SUMMARY OF THE INVENTION

An object of this invention is to provide a method for the production of a pasted SOI substrate which precludes the occurrence of voids even in the peripheral part of pasted wafers and the SOI substrate.

The method for the production of a pasted SOI substrate of this invention comprises pasting a first Si substrate possessing a $SiO_2$ surface and a second Si substrate possessing a Si surface on the $SiO_2$ surface and the Si surface. The Si surface of the second substrate is characteristically hydrophobic due to a washing treatment before the first substrate and the second substrate are pasted.

The SOI substrate of this invention is further characterized by the presence of Si in the area stretching to 2 mm from the peripheral edge of the substrate and the absence of locally distributed voids in the peripheral part of the substrate.

Now, this invention will be described below.

The excess water adsorbed to the wafer may be cited as one of the causes for the occurrence of voids in the interface of pasting. For the purpose of diminishing such voids, therefore, it becomes necessary to properly remove the adsorbed water before the substrates are pasted.

With respect to determining of the amount of adsorbed water on the $SiO_2$ surface, while the amount of adsorbed water is not easily determined immediately after the sample is extracted from purified water, it nearly levels off several minutes to ten-odd minutes after being spin dried. The inventors' experiment with an APIMS device has confirmed this constant amount to be in the approximate range of $0.8-1\times10^{15}$ molecules/$cm^2$. It has been further found that this amount varies with the temperature and the humidity of an environment in which the washed wafers are left standing, but that it depends very little on the washing method imparting hydrophobicity or hydrophilicity.

It has been also clarified that the amount of adsorbed water on the Si surface indeed depends on the duration of the standing of the sample at rest after the washing treatment, but that it depends to a greater extent on the method of washing. When a bare wafer is immersed in HF (an aqueous 1.5% hydrofluoric acid solution), a hydrophobic washing liquid, thoroughly rinsed with purified water, spin dried, and left standing at rest for about 60 minutes, and then tested for the amount of adsorbed water using the APIMS, for example, the amount is found to be about $6\times10^{13}$/$cm^2$. When the same sample is washed with SC-2 (a 1:1:5 mixture of $HCl:H_2O_2:H_2O$), a hydrophilic washing liquid, thoroughly rinsed with purified water, spin dried, left standing at rest for about 60 minutes, and tested for the amount of adsorbed water using the APIMS, the amount is found to be about $3\times10^{14}$/$cm^2$. It is inferred that this difference in the amount of adsorbed water is event greater when the test is made immediately after the spin drying.

When the control of the amount of adsorbed water on the wafer surface is effected by the hydrophobic and hydrophilic methods of washing the Si surface-containing side of the wafer, the conspicuous difference is obtained with high repeatability. Though controlling the amount of adsorbed water may be attained by such other methods as allowing the washed sample to stand at rest for a prescribed time or giving the washed sample a positive drying in a vacuum, for example, these methods do not offer very effective control because they after all rely on the environment in which the pasting is made. Further, controlling the amount of adsorbed water on the $SiO_2$ surface-containing wafer side is difficult because the area for control is narrow.

From the results of the studies described above, it is inferred that the conditions for enabling pasting to proceed without the occurrence of peripheral voids of millimeter size caused by an excessive amount of adsorbed water are (1) that the pasting should take place on the combination of Si and $SiO_2$ and (2) that at least the Si side should have undergone the hydrophobic method of washing.

The inventors have also studied the extent to which the amount of the adsorbed water on Si surface can be controlled exclusively by the method of washing. First, concerning the hydrophilic washing for which SC-1 (a mixture of $NH_4OH:H_2O_2:H_2O$), $H_2SO_4:H_2O_2$, $HNO_3$, etc. are available in addition to SC-2, it has been found that the amounts of these liquids which remain in the adsorbed state become nearly equal after the washed samples are finally rinsed with purified water. Then, concerning the hydrophobic washing, it has been found that even when HF is used in a varying concentration or when BHF (a buffered hydrofluoric acid) solution is used instead, the amounts of the liquids remaining in the adsorbed state likewise become nearly equal. The results indicate that intermediate values between the values obtained by the hydrophobic treatment and those obtained by the hydrophilic treatment are difficult to obtain.

In the pasting of a Si and a $SiO_2$ substrate, the relation between the various methods used for washing and the peripheral voids or the voids, several $\mu$m—several hundred $\mu$m in diameter (hereinafter referred to as "microvoids"), scattered in the wafer surface has been studied. When the two substrates are subjected to a hydrophilic washing, then pasted, heat-treated at 800° C.–1000° C., and observed by transmission with the aid of an infrared camera, it is found that voids 500, 1 mm through several mm in diameter, inevitably occur along the outer peripheral part of the wafer as shown in FIG. 5. In contrast, when the two substrates are subjected to a hydrophobic washing and then pressed against each other in an effort to paste them, they will at times fail to be pasted perfectly if either of the wafers happens to be exposed to stress. This failure may be logically explained by supposition that the Van der Waals force is not sufficient because of the shortage of water on the surface. They could be pasted if the stress on the wafer was small and the surface was smooth. The peripheral voids are markedly decreased when the conversion of a wafer on one side into a layer of a small wall thickness is carried out after a heat treatment at 800° C.–900° C. In this case, however, microvoids inevitably occur at a density roughly several times through ten-odd times the density observed in the sample which undergoes a hydrophilic treatment. This trouble again may be explained by supposing that the Van der Waals force is not sufficient. When the Van der Waals force is not sufficient, the microgaps which arise in the interface between the two substrates survive all attempts to eliminate them and, consequently, the wafers, having undergone a heat treatment, inevitably form an incomplete interface. It is inferred that the polishing which is performed to convert a wafer into a layer of a small thickness exerts stress on the interface between the pasted Such stress grows proportionally as the polished surface becomes closer to the interface, and the strain consequently generated focuses on incomplete points and gives rise to the microvoids.

The results of the tests described above, when summarized, lead to the following conclusions: (1) Concerning the amount of water adsorbed to the Si surface, an intermediate value between the hydrophobic treatment and the hydrophilic treatment is not easily obtained. (2) A Si surface, when subjected to hydrophobic washing and pasted with a $SiO_2$ surface, produces markedly fewer voids than when the Si surface is subjected to hydrophilic washing. (3) The two substrates subjected to hydrophobic washing and pasted have a weak Van der Waals force and tend to generate microvoids as compared with those subjected to hydrophilic washing.

As a result of a further study, it has been found that the microgaps in the interface between the pasted substrates are eliminated by heightening the temperature of the heat treatment. This elimination is logically explained by a supposition that the $SiO_2$ begins to soften at the same time that the air entrapped in the gaps begins to diffuse. It has been also found that the temperature at which this phenomenon occurs is about 900° C. If the two substrates which have undergone the hydrophilic treatment are used in this case, the microvoids will enlarge conversely because of the collection of excess water in the form of high-pressure gas in the microgaps. The voids 500 which appear along the outer peripheral part of the pasted wafer illustrated in FIG. 5 are precisely the result of this enlargement. It is inferred that these voids occur because the outer peripheral part of the wafer has a slightly larger roughness than the central part thereof and because the gas of excess water is not completely diffused through the interface to the exterior. Incidentally, when two $SiO_2$ substrates are similarly pasted to each other, the same result tends to occur unless the excess adsorbed water is controlled.

From the results of the studies described above, it is evident that the conditions for successfully pasting two substrates without the occurrence of not only voids of millimeter size but also microvoids are (1) that the pasting should take place on the combination of Si and $SiO_2$, (2) that at least the Si side should have undergone the hydrophobic method of washing, and (3) that the pasted substrates should then be heat-treated at a temperature of not lower than 900° C.

To be more specific, when the Si and $SiO_2$ substrates are pasted and then annealed at a low temperature (400° C.–800° C.), the density of microvoids is higher in the samples which have undergone a hydrophobic washing than when those which have undergone a hydrophilic washing. In both the two sets of samples, the density of microvoids decreases in accordance as the temperature of heat treatment rises. Under the annealing conditions involving temperatures in the range of 1000° C.–1100° C., the difference nearly ceases to exist between the samples of hydrophilic washing and those of hydrophobic washing.

Concerning the peripheral voids, however, the samples of hydrophobic washing generate no peripheral voids even at high temperatures, whereas those of hydrophilic washing generate peripheral voids in a range from low temperatures through high temperatures. Incidentally, the peripheral voids, unlike the microvoids, do not have their density notably changed (in spite of a slight change in void diameter) by the temperature of heat treatment.

In the formation of devices on a semiconductor substrate, how closely to the peripheral part of the substrate these devices are derived in high yield is an important factor in terms of cost. The SOI substrate which is formed by the pasting method, however, has the problem that the Si film tends to shed the peripheral part thereof. One of the causes of this problem is the occurrence of peripheral voids which is ascribable to the roughness of the periphery of a wafer and the entrapment of water (steam) in that area. The peripheral voids generally occur outside a distance of 5 mm from the peripheral part, though this distance is affected by the conditions of annealing, the magnitude of roughness of the wafer, etc. The area sustaining the peripheral voids, therefore, does not allow formation of devices. Part of the trade advocates a practice of completely removing the peripheral void area of the film itself by photolithographically etching this area before the film is subjected to a process for the formation of devices.

There are times when the formation of devices is not attainable within a distance of about 5 mm from the peripheral edge in spite of the absence of peripheral voids.

In conversion of a wafer into a thin film by polishing, for example, the so-called "film sagging", a phenomenon in which the film becomes extremely thin in the peripheral part, inevitably occurs because the polishing rate is larger in the peripheral part of the film than in the central part. Though this problem can be attributed largely to the performance of the polishing apparatus being used, it is not easily solved. The wafer which is set in place on the polishing apparatus is generally polished by being simultaneously rotated and revolved. During this operation, the sliding speed which the wafer produces relative to the polishing pad varies in the central and peripheral parts of the wafer surface. With respect exclusively to the rotational motion of the wafer, the sliding speed of the wafer relative to the polishing pad is naturally smaller in the part close to the center than in the outer peripheral part. The difference in the sliding speed results not only in a difference in the amount of sliding motion, but also in a difference in the amount of heat generated. The amount of the heat thus generated further gives birth to a difference in the polishing rate and aggravates the polishing thickness distribution (film sagging).

The pasted SOI wafer which allows Si to survive within a distance of 2 mm from the periphery and yet allows the Si surviving peripheral area to manifest characteristic properties favorably comparable with those in the central part regarding the manufacture of devices is not easily manufactured.

The problems described above must be overcome for the purpose of obtaining an SOI thin film which is tightly pasted as far as the distance of 2 mm from the periphery. First, pasting must be carried out without the occurrence of peripheral voids. This can be accomplished by pasting a Si and a SiO$_2$ substrate at least the Si substrate having been given a hydrophobic washing treatment and then heat-treated at a temperature of not lower than 900° C. Secondly, the finishing step in the manufacture of an SOI wafer must be effected by selective etching with a high selectivity ratio or local plasma etching instead of polishing. By combining these procedures, the SOI wafer in which the Si film survives in such a way as to allow formation of devices as far as a distance of 2 mm from the periphery can be produced.

By further performing the heat treatment on the two pasted substrates in an oxidizing atmosphere, the tightly joined part is allowed to expand in the peripheral part, and the SOI wafer in which the Si film survives as far as 1 mm or even less than 1 mm from the periphery can be produced.

An oxidation to be performed subsequently to the heat treatment brings about the same result as the use of the oxidizing atmosphere in the heat treatment.

According to this invention, by pasting a hydrophobic Si substrate and a SiO$_2$ surface, the bubbles (voids) which are liable to occur particularly in the most peripheral part of the wafer can be repressed, the area of the most peripheral part available for the manufacture of devices can be widened, the number of devices derivable from the area can be increased, and the production yield can be improved.

DETAILED DESCRIPTION OF THE PREFERRED EMBODIMENTS

The method of this invention for the formation of the SOI substrate will be outlined below with reference to FIGS. 1A to 1D, FIGS. 2A to 2E, FIGS. 3A to 3D and FIGS. 4A and 4B.

Figure 1A:
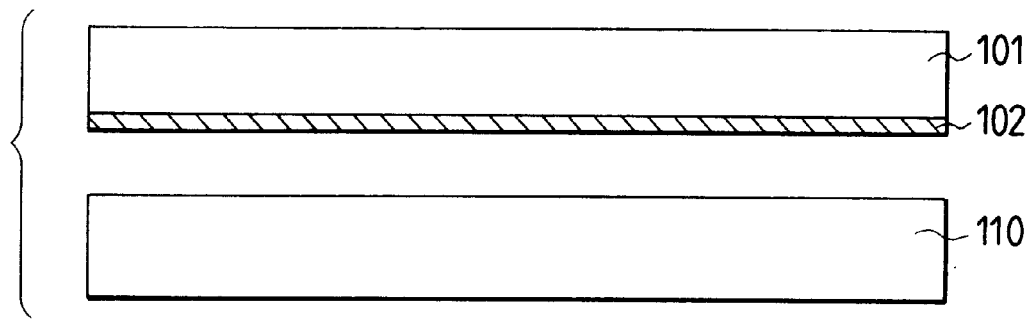
FIGS. 1A, 1B, 1C and 1D are model cross-sections illustrating one embodiment of the method of this invention for the formation of a pasted SOI substrate and first and second working examples thereof.

[FIG. 1A] First, a first Si substrate 101 having a surface of SiO$_2$ (in the diagram, 102 represents a SiO$_2$ layer) and a second Si substrate 110 having a surface of Si are prepared. As the simplest system of the first Si substrate 101, a Si substrate having an oxidized surface may be exemplified. Another possible system thereof may be a Si substrate having SiO$_2$ deposited on the surface thereof as by CVD or a multilayer structure having not a Si substrate but a Si layer incorporated therein. As a concrete example of this system, what is obtained by rendering porous the surface or the entire mass of a Si substrate, epitaxially growing a Si single crystal thin film on the porous texture of the Si substrate, and further oxidizing the surface of the Si single crystal thin film may be exemplified. As other concrete examples of the system, what is obtained by epitaxially growing a Si single crystal thin film on a sapphire substrate and further oxidizing the surface of the thin film and what is obtained by oxidizing the surface of a heteroepitaxial substrate or superposing SiO$_2$ on the surface thereof as by CVD may be cited.

The second Si substrate 110 may be considered as the first Si substrate which has no SiO$_2$ surface but has a Si surface.

Figure 1B:
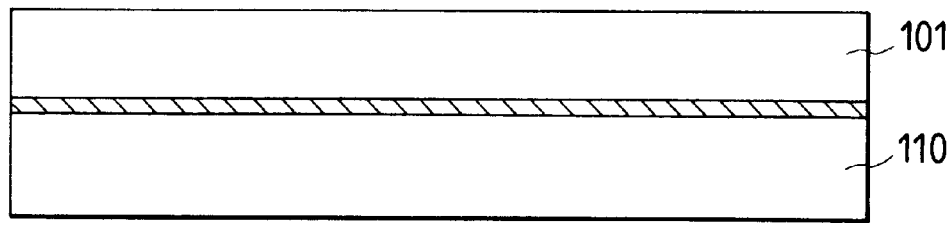

[FIG. 1B] Then, the second Si substrate 110 has the Si surface thereof rendered hydrophobic. The most popular method that is used for rendering the Si surface hydrophobic consists of immersing the surface in a hydrofluoric acid type washing liquid. At this time, the first Si substrate 101 having a SiO$_2$ surface may be given either a hydrophobic treatment or a hydrophilic treatment. The reason for this indifference as to the kind of treatment is that the $SiO_2$ surface produces virtually no difference in the amount of adsorbed water in the treatment solely consisting of immersion in a solution as already pointed out.

Then, the surfaces of these two substrates are pasted together and the pasted substrates are subsequently heat-treated at a temperature of not lower than 900° C. Though the duration of the heat-treatment is arbitrary, it is several hours at temperatures in the neighborhood of 900° C. and several minutes through some tens of minutes at 1200° C.

Figure 1C:
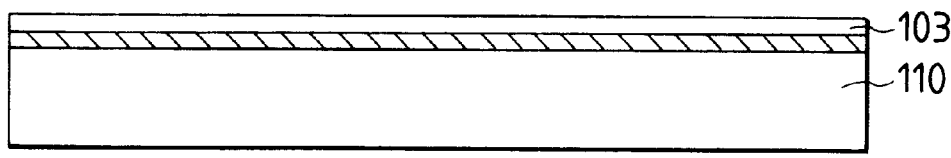
Figure 1D:
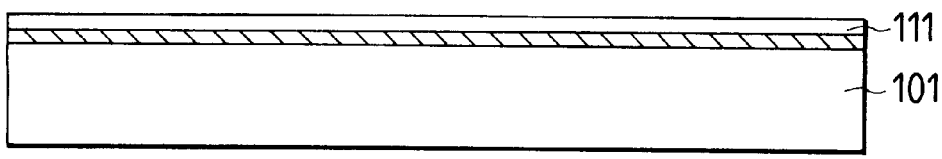

[FIG. 1C] The resultant integrated substrate is thinned from either of the opposite sides thereof eventually to produce a construction having a Si layer 103 remaining on the $SiO_2$ (the diagram of FIG. 1C depicting a case of thinning the first substrate 101). The thickness of the Si layer is arbitrary. The methods available for thinning the integral substrate are broadly divided into polishing and etching. By either of these methods, thinning is effected efficiently when the greater part of the wall to be removed is ground out. FIG. 1D depicts a case of thinning the second Si substrate 110 and allowing the Si layer 111 to remain.

The polishing method and the etching method have their own merits and disadvantages. For the manufacture of an extremely thin SOI layer, the selective etching technique can be utilized. The etching method which permits easy control of the film thickness is considered to be slightly advantageous over the polishing method. As one version of the selective etching method, the method for forming an SOI substrate using porous silicon will be described below with reference to FIGS. 2A to 2E and FIGS. 3A to 3D.

Figure 2A:
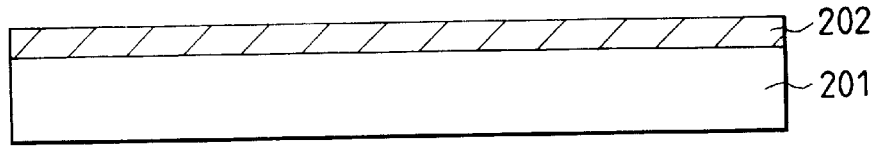
FIGS. 2A, 2B, 2C, 2D and 2E are model cross-sections illustrating another embodiment of the method of this invention for the formation of a pasted SOI substrate and third working example thereof.
Figure 4A:
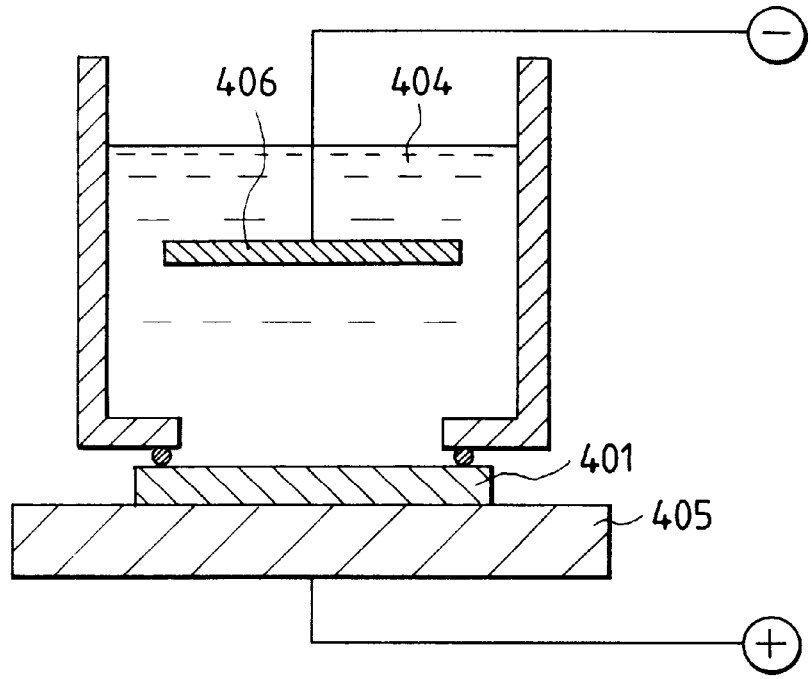
FIGS. 4A and 4B are cross-sections illustrating the construction of an apparatus for production to be used in the method of this invention for the production of a pasted SOI substrate.
Figure 4B:
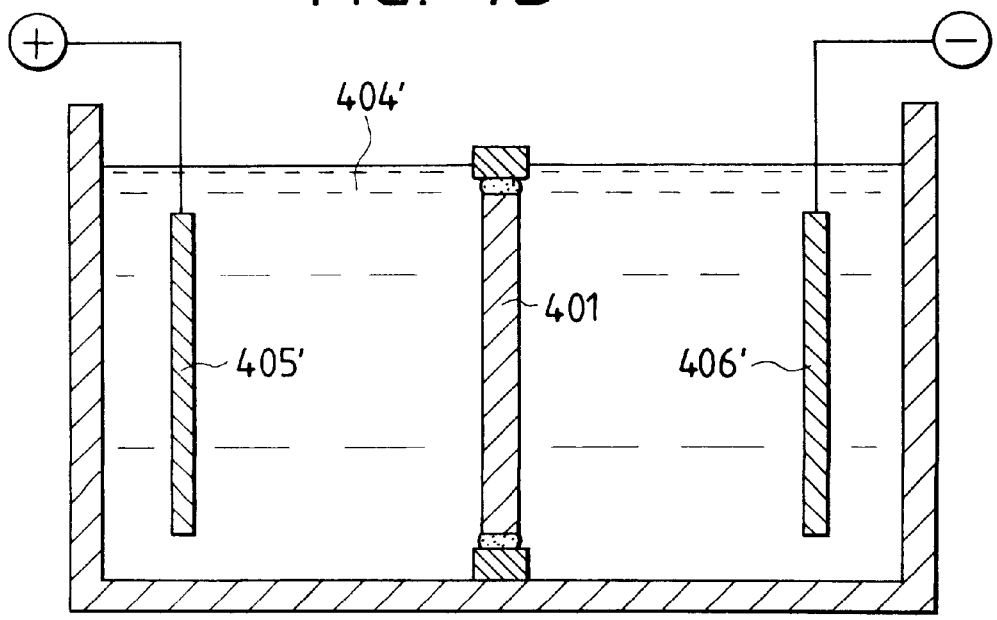

[FIG. 2A] First, a porous Si layer 202 is formed by subjecting a single crystal Si substrate 201 to anodic formation. The thickness of the porous texture to be formed in this case may be several $\mu$m through some tens of $\mu$m in the surface layer on either side of the substrate. The anodic formation, when necessary, may be effected throughout the entire volume of the substrate. The method for the formation of the porous Si layer will be described with reference to FIGS. 4A and 4B. First, a p-type single crystal Si substrate 401 will be prepared as a substrate. An n-type equivalent is usable. If the equivalent is used, then it will be either limited to low resistance or exposed to radiation capable of promoting formation of holes in the surface. The substrate 401 is set in place in an apparatus constructed as illustrated in FIG. 4A. Specifically, one side of the substrate contacts a hydrofluoric acid type solution 404, a negative electrode 406 is disposed on the solution side, and a positive metallic electrode 405 contacts the opposite side of the substrate 401. As illustrated in FIG. 4B, a positive electrode side 405' may be endowed with a potential through the medium of a solution 404'. In either of the setups mentioned above, the formation of a porous texture is initiated on the negative electrode side which is in contact with the hydrofluoric acid type solution. Generally concentrated hydrofluoric acid (49% HF) is used as the hydrofluoric acid type solution 404. When the concentrated hydrofluoric acid is gradually diluted with purified water, the acid diluted to a certain concentration induces an objectionable etching action, though depending on the magnitude of an electric current to be passed. During the anodic formation, the surface of the substrate 401 inevitably emits bubbles. For the purpose of efficiently removing the bubbles, an alcohol may be added as a surfactant. As concrete examples of the alcohol used effectively herein, methanol, ethanol, propanol, and isopropanol may be cited. Instead of using the surfactant, a stirrer may be utilized to stir the solution while the anodic formation is in process. The negative electrode 406 is made of such a material as gold (Au) or platinum (Pt) which is incapable of being corroded by the hydrofluoric acid solution. The positive electrode 405 may be made of any metallic materail which is commonly used for anodes. The surface of the positive electrode 405 is preferably coated with a metallic film resistant to the hydrofluoric acid solution, because the hydrofluoric acid solution 304 reaches the positive electrode 405 by the time the entire volume of the substrate 401 has undergone the anodic formation. The magnitude of the electric current to be used for performing the anodic formation is some hundreds of $mA/cm^2$ at the maximum and may assume any value other than 0 at the minimum. This magnitude is set within a range in which perfect epitaxial growth is attained on the surface of a porous Si layer. Generally, the speed of the anodic formation increases and the density of the porous Si layer decreases in accordance as the magnitude of the electric current increases. The volume occupied by the pores proportionately increases. This volume varies the conditions for the epitaxial growth.

Figure 2B:
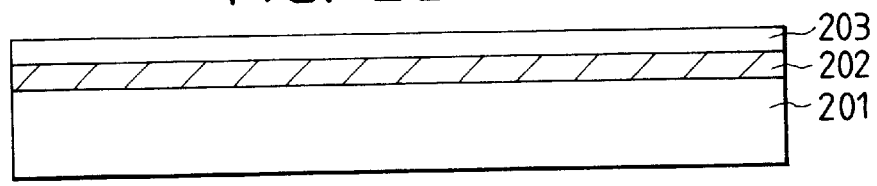

[FIG. 2B] On the porous layer 202 which is formed as described above, a nonporous single crystal Si layer 203 is epitaxially grown. The epitaxial growth is effected by thermal CVD, reduced-pressure CVD, plasma CVD, molecular-beam epitaxy, or sputtering. The thickness of the epitaxially grown film is equal to the design value of the thickness of the active layer.

Figure 2C:
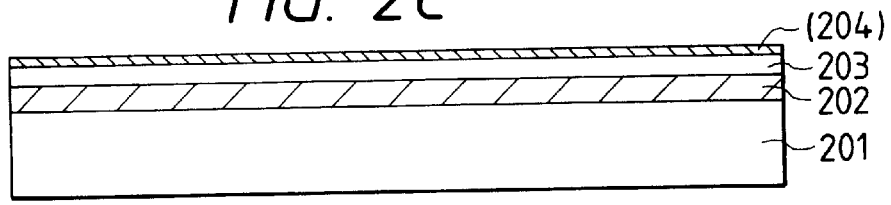

[FIG. 2C] The first Si substrate is completed by oxidizing (reference numeral 204 denoting a $SiO_2$ film) the surface of the epitaxial layer 203 of the substrate obtained by the method described above. A separately prepared Si substrate 210 constitutes the second Si substrate.

The thickness of the $SiO_2$ film of the first Si substrate 201 is arbitrary and is only required to equal to the thickness of a buried $SiO_2$ layer to be designed.

Figure 2D:
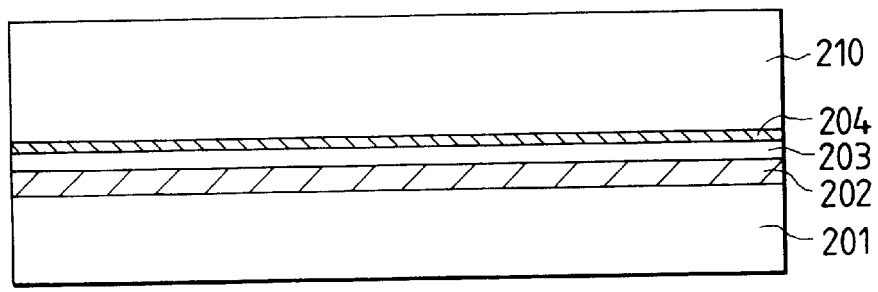

[FIG. 2D] The first substrate 201 mentioned above and the second substrate 210 destined to serve as a support substrate are washed and then pasted together. The method for this washing has only to conform to the standard procedure which is followed in washing a semiconductor substrate (before the step of oxidation, for example) with necessary modifications. It must use at the final step of washing a washing liquid which imparts hydrophobicity to the Si surface. This washing liquid is a hydrofluoric acid type solution. Incidentally, the first substrate which has a $SiO_2$ surface it not always required to be finally washed with the hydrofluoric acid type solution.

Then, the integrated substrate obtained by pasting as described above is heat-treated. The temperature of this heat treatment is preferred to be as high as possible. If it is unduly high, however, the porous layer 202 will induce a structural change or the impurity contained in the substrate will undergo diffusion in the epitaxial layer. Thus, the temperature and the duration of the heat treatment are selected so as to preclude such unwanted phenomena. Specifically, the temperature is suitable in the approximate range of 900° C.–1100° C.

[FIG. 2E] Subsequently, the Si substrate part 201 and the porous part 202 are selectively removed, and the epitaxially grown layer 203 of the first substrate is left behind. First, the Si substrate part 201 is ground with a surface grinder or removed with an alkali solution such as, for example, potassium hydroxide or aqua ammonia or with an organic alkali solution such as, for example, TMAH. By etching, the removal is effectively attained in a hot solution having a temperature of not lower than 80° C. The polishing or etching is terminated provisionally at the time that the porous part 202 is exposed. The exposed porous part 202 is selectively etched using a mixed solution of hydrofluoric acid/aqueous hydrogen peroxide solution or an alkali solution. By appropriately controlling the concentration of the etching liquid, the selectivity ratio of etching between the porous Si layer and the single crystal Si layer can be increased to the approximate maximum of 100,000:1. As concerns the liquid concentration, the hydrofluoric acid concentration in the hydrofluoric acid type solution is in the approximate range of several % to several ppm, preferably 0.1% to 10 ppm. As concrete examples of the alkali, ammonia, TMAH (tetramethyl ammonium hydroxide), and ethylene diamine may be cited. Etching with the alkali is preferred to be carried out with the same liquid concentration as in the hydrofluoric acid type solution. For the purposes of enabling the etching liquid to permeate efficiently into the pores of the porous layer, promoting etching action, and ensuring uniform progress of etching, it is advantageous to use an ultrasonic washing device.

Figure 2E:
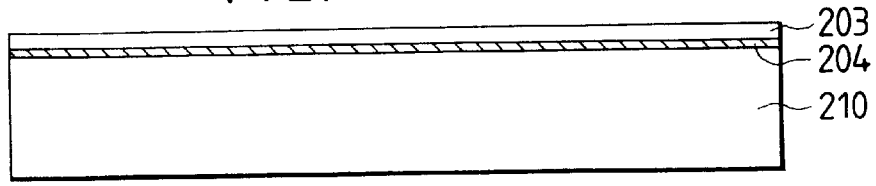
Figure 3A:
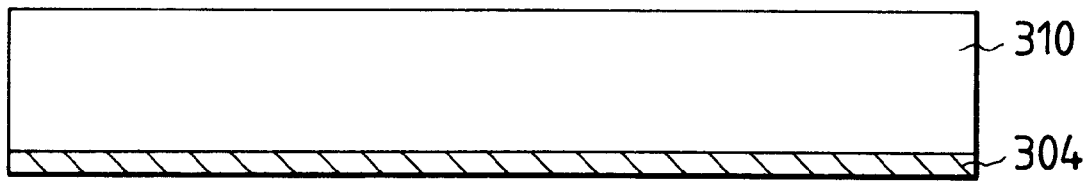
FIGS. 3A, 3B, 3C and 3D are model cross-sections illustrating yet another embodiment of the method of this invention for the formation of a pasted SOI substrate and fourth working example thereof.
Figure 3B:
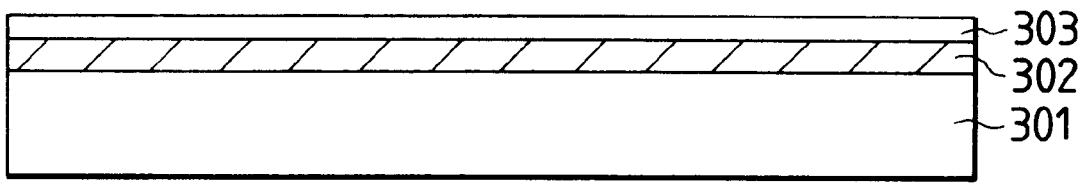

FIGS. 3A to 3D illustrate another mode of effecting the method for selective etching with a porous Si layer. FIG. 3A depicts the first substrate of this invention which has an oxide film 304 formed on a Si substrate 310. FIG. 3B represents the second Si substrate of this invention having a porous Si layer 302 and a nonporous Si layer 303 on the Si substrate 301 obtained up to the step of FIG. 2B already explained. The nonporous Si layer 303 is formed by epitaxial growth on the porous Si layer 302. In the modes described with reference to FIGS. 2A to 2E, the epitaxially grown substrate is the first Si substrate and the Si substrate is the second Si substrate. In the modes of FIGS. 3A to 3D, they are reversed.

Figure 3C:
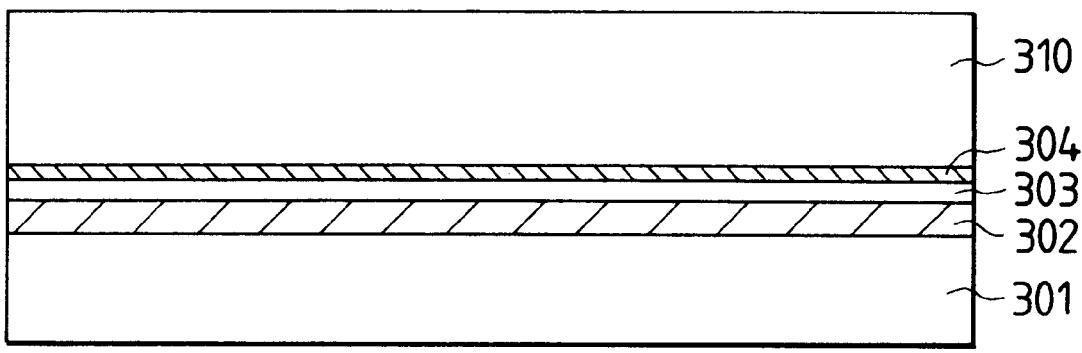
Figure 3D:
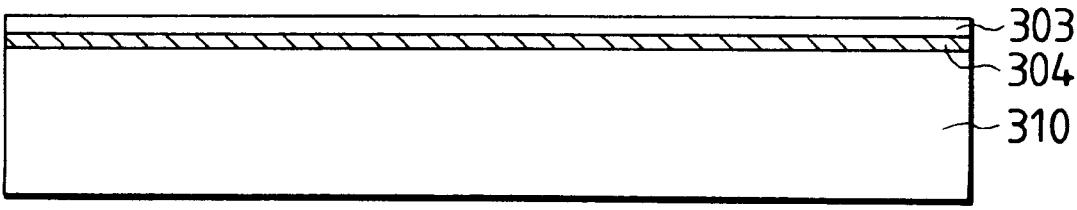

Then, the second Si substrate is washed with a hydrofluoric acid type solution so that the Si surface thereof to be used for pasting will acquire hydrophobicity. Thereafter, the $SiO_2$ surface 304 of the first Si substrate 310 and the Si surface 303 of the second Si substrate 301 are pasted together as illustrated in FIG. 3C to obtain such an SOI substrate as is illustrated in FIG. 3D by adopting the same procedure as explained with reference to FIGS. 2A to 2E.

Now, working examples of this invention will be described below.

EXAMPLE 1

The first example of this invention will be described below with reference to FIGS. 1A to 1D.

[FIG. 1A] Two 5-inch p-type single crystal Si substrates (10 Ωcm–20 Ωcm) having a thickness of 625 μm were prepared. The surface of one of the two substrate was oxidized (oxidized film 102 in the diagram) in a thickness of 0.5 μm. The oxidized side was used as a first Si substrate 101 and the other side which was left unprocessed as a second Si substrate 110.

[FIG. 1B] The two substrates 101 and 110 were washed with a $NH_4OH:H_2O_2:H_2O$ solution, rinsed with purified water, then washed with a $HF:H_2O$ solution (1.5%), rinsed, spin dried, and pasted together. The pasted substrates were heat-treated at 1050° C. for two hours.

[FIG. 1C] The substrate 101 was ground from the first Si substrate 101 side to a depth of 615 μm by the use of a surface grinder. It was subsequently ground to mirror finish with colloidal silica abrasive until the Si film 101 remained in a thickness of 2 μm on the Si oxide film 102 to obtain an SOI wafer.

Figure 5:
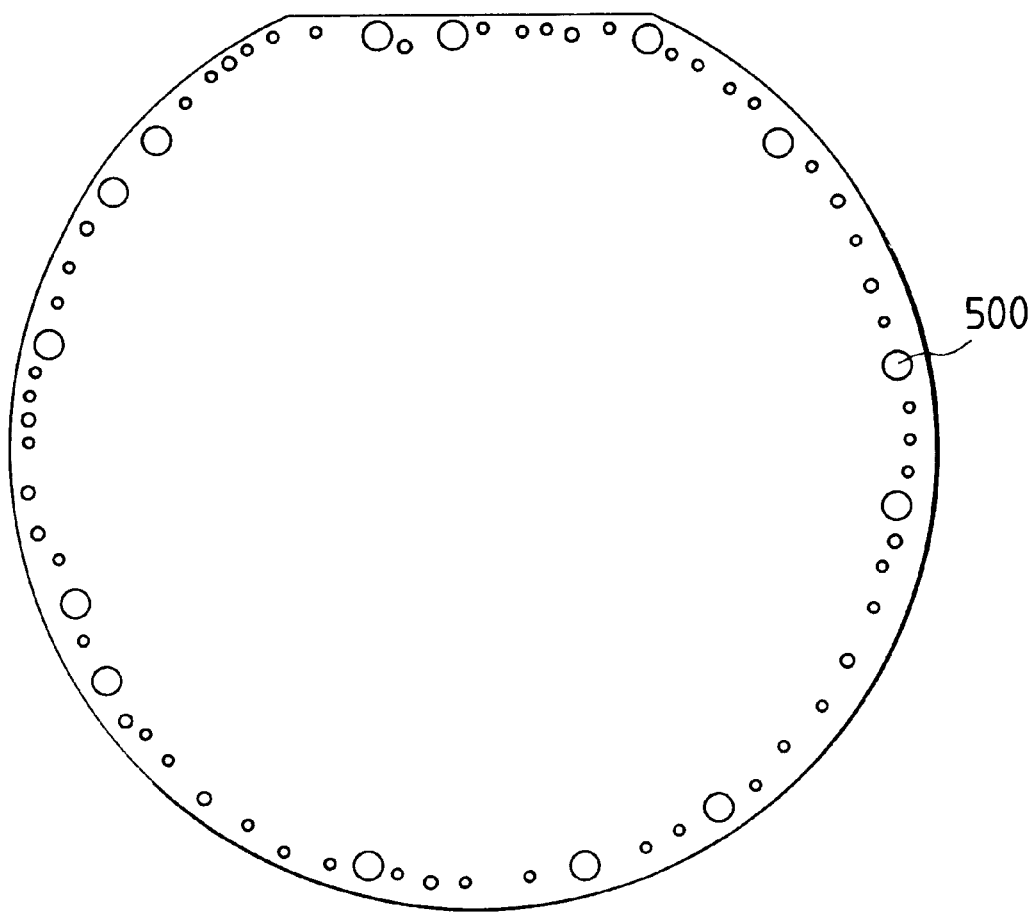
FIG. 5 is a diagram illustrating the image of voids locally present in the wafer periphery which frequently occur in conventional pasted substrates.

Microvoids which inevitably occurred in this SOI wafer had diameters in the approximate range of 0.5 μm–10 μm and a density of about 0.1 piece/cm². A comparative sample produced at the same time, with the washing prior to the pasting discontinued at the step using the $NH_4OH:H_2O_2:H_2O$ solution (the silicon surface rendered hydrophilic), was on par with the sample of the working example in terms of microvoids but had large voids, several mm in diameter, formed continuously in an annular pattern in the peripheral part as shown in FIG. 5.

EXAMPLE 2

The second working example of this invention will be described below with reference to FIGS. 1A to 1D.

[FIG. 1A] Two 5-inch p-type single crystal Si substrates (10 Ωcm–20 Ωcm) having a thickness of 625 μm were prepared. The surface of one of the two substrate was oxidized (oxidized film 102 in the diagram) in a thickness of 0.5 μm. The oxidized side was used as a first Si substrate 101 and the other side which was left unprocessed as a second Si substrate 110.

[FIG. 1B] The two substrates 101 and 110 were washed with a $NH_4OH:H_2O_2:H_2O$ solution, rinsed with purified water, then washed with a $HF:H_2O$ solution (1.5%), rinsed, spin dried, and pasted together. The pasted substrates were heat-treated at 1200° C. for 10 minutes.

[FIG. 1D] The substrate 110 was ground from the second Si substrate side to a depth of 615 μm by the use of a surface grinder. It was subsequently ground to a mirror finish with colloidal silica abrasive until the Si film 101 remained in a thickness of 2 μm on the Si oxide film 102 to obtain an SOI wafer.

Microvoids which inevitably occurred in this SOI wafer had diameters in the approximate range of 0.5 μm–3 μm and a density of about 0.1 piece/cm². A comparative sample produced at the same time, with the washing prior to the pasting discontinued at the step using the $NH_4OH:H_2O_2:H_2O$ solution (the silicon surface rendered hydrophilic), was on par with the sample of the working example in terms of microvoids but had voids, though averaging in reduced diameters of several hundreds of μm as compared with the comparative sample of Example 1, remaining in an annular pattern just the same.

EXAMPLE 3

[FIG. 2A] A 5-inch single crystal p-type Si substrate (0.01 Ωcm–0.02 Ωcm) 201 having a thickness of 625 μm was prepared, set in place in such an apparatus as illustrated in FIG. 4A, and subjected to anodic formation to convert the surface of the Si substrate 201 into a porous Si layer 202 in a thickness of 20 μm. For the anodic formation, a 49% HF solution was used as the solution 304, and the current density was set at 1 mA/cm². The formation of the porous texture proceeded at a rate of about 1 μm/minute, and the porous layer, 20 μm in thickness, was obtained in about 20 minutes.

[FIG. 2B] On the porous Si layer 202 mentioned above, a single crystal Si layer 203 was epitaxially grown to a thickness of 0.25 μm by the CVD method. The conditions for the deposition of this layer were as follows:

Kind of gas used: $SiH_4/H_2$
Flow volume of gas: 0.62/140 (1/min)
Temperature: 850° C.
Pressure: 80 Torr
Rate of growth: 0.12 μm/min

[FIG. 2C] The substrate 201 manufactured by the method described above was treated in an atmosphere of steam at 900° C. to obtain an oxide film 204 0.1 μm in thickness.

[FIG. 2D] The substrate having formed an oxidized surface as mentioned above was used as the first Si substrate, and a 5-inch p-type Si substrate (10 Ωcm–20 Ωcm) prepared in advance was used as the second Si substrate. These two substrates were washed with a system using acid and ammonia, finally washed with a dilute hydrofluoric acid solution (1.5%), rinsed with purified water, spin dried, and pasted together on the obverse surfaces thereof. The pasted substrates were heat-treated at 1100° C. for two hours.

[FIG. 2E] After the heat treatment, the Si substrate part 201, about 600 μm in thickness, on the first substrate side was ground with a surface grinder. After the porous Si layer 202 was exposed, the substrate was immersed in a selective etching solution and exposed to an ultrasonic wave until the porous part 202 alone was wholly etched selectively. The composition of the selective etching solution, the etching speed relative to the single crystal Si layer, and the etching speed relative to $SiO_2$ were as shown below.

Selective etching solution: Aqueous TMAH solution (24 ppm)

Si etching speed: 5 Å/min $SiO_2$ etching speed: Not more than 1 Å/minute

As a result, an SOI substrate provided with a single crystal Si film, about 0.2 μm in thickness, was completed on the $SiO_2$ layer 0.1 μm in thickness. Microvoids which inevitably occurred in the completed SOI wafer had diameters in the approximate range of 0.5 μm–3 μm and a density of not more than 0.5 piece/cm². The SOI film had a very satisfactory thickness distribution, 0.2 μm±1.5%.

A comparative sample produced at the same time, with washing prior to the pasting discontinued at the step using the $NH_4OH:H_2O_2:H_2O$ solution (the silicon surface rendered hydrophilic), was on par with the comparative sample of Example 1 in terms of microvoids but had voids, several mm in diameter, formed in an annular pattern similarly to the comparative example.

EXAMPLE 4

Now, the fourth example of this invention will be described in detail below with reference to FIGS. 3A to 3D.

First, a 5-inch single crystal p-type Si substrate (0.01 Ωcm–0.02 Ωcm) 301 having a thickness of 625 μm was prepared, set in place in such an apparatus as illustrated in FIG. 4A, and subjected to anodic formation to convert the surface of the Si substrate 301 into a porous Si layer 202 in a thickness of 20 μm. For the anodic formation, a 49% HF solution was used as the solution 304, and the current density was set at 0.8 mA/cm². The formation of the porous texture proceeded at a rate of about 0.8 μm/minute and the porous layer, 20 μm in thickness, was obtained in about 25 minutes.

[FIG. 3B] On the porous Si layer 302 mentioned above, a single crystal Si layer 303 was epitaxially grown to a thickness of 1.5 μm by the CVD method. The conditions for the deposition of this layer were as follows:

Kind of gas used: $SiH_2Cl_2/H_2$

Flow volume of gas: 0.45/200 (1/min)

Temperature: 950° C.

Pressure: 760 Torr

Rate of growth: 0.25 μm/min

[FIG. 3A] The substrate 301 manufactured by the method described above was used as the second Si substrate (no oxide film formed herein). This second Si substrate and a separately prepared p-type Si substrate (10 Ωcm–20 Ωcm) 310 were oxidized in an atmosphere of steam at 1050° C. to a thickness of 1.5 μm.

[FIG. 3C] These two substrates were washed with a system using acid and ammonia, finally washed with a dilute hydrofluoric acid solution (1.5%), rinsed with purified water, spin dried, and pasted together on the obverse surfaces thereof. The pasted substrates were heat-treated at 1100° C. for two hours.

[FIG. 3D] After the heat treatment, the Si substrate part 301, about 600 μm in thickness, on the second substrate side was ground with a surface grinder. After the porous Si layer 302 was exposed, the substrate was immersed in a selective etching solution and exposed to an ultrasonic wave until the porous part 302 alone was wholly etched selectively. The composition of the selective etching solution, the etching speed relative to the single crystal Si layer, and the etching speed relative to $SiO_2$ were as shown below.

Selective etching solution: Aqueous 0.005% hydrofluoric acid solution

Si etching speed: 3 Å/min $SiO_2$ etching speed: 2 Å/min

As a result, an SOI substrate provided with a single crystal Si film, about 1.5 μm in thickness, was completed on the $SiO_2$ layer, 1.5 μm in thickness. Microvoids which inevitably occurred in the completed SOI wafer had diameters in the approximate range of 0.5 μm–3 μm and a density of not more than 0.3 piece/cm².

A comparative sample produced at the same time, with washing prior to the pasting discontinued at the step using the $NH_4OH:H_2O_2:H_2O$ solution (the silicon surface rendered hydrophilic), was on par with the comparative sample of Example 1 in terms of microvoids but had voids, several mm in diameter, formed in an annular pattern similarly to the comparative example.

What is claimed is:

1. A method for the production of an SOI substrate comprising the steps of:

preparing a first Si substrate having a silicon dioxide surface and a second Si substrate having a silicon surface;

treating said silicon surface of said second Si substrate to form a hydrophobic silicon surface;

placing said first Si substrate upon said second Si substrate to bring said silicon dioxide surface and said hydrophobic silicon surface into contact;

heat treating said contacted first and second Si substrates at a temperature of not lower than 900° C. to bond said first and second Si substrates to each other; and removing a part of said first or said second Si substrate to leave said silicon dioxide sandwiched between a remainder of said first or said second Si substrates and the substrate bonded thereto, thereby providing said SOI substrate.

2. The method for the production of an SOI substrate according to claim 1, wherein said first Si substrate or said second Si substrate is formed as a thin layer substrate by polishing.

3. The method for the production of an SOI substrate according to claim 1, wherein said first Si substrate or said second Si substrate is formed as a thin layer substrate by etching.

4. The method for the production of an SOI substrate according to claim 1, comprising treating said silicon surface of said second substrate with a solution containing hydrofluoric acid to form said hydrophobic silicon surface.

5. The method for the production of an SOI substrate according to claim 4, wherein a hydrofluoric acid concentration in said solution is 1.5%.

6. The method for the production of an SOI substrate according to claim 1, wherein said hydrophobic silicon surface of said second substrate has a water content of not more than $6 \times 10^{13}$ molecules/cm$^2$.

7. The method for the production of an SOI substrate according to claim 1, wherein said heat treatment is conducted at a temperature of about 900° C. to about 1200° C.

8. A method for the production of an SOI substrate comprising the steps of:

preparing a first substrate having a porous silicon layer, a single crystal silicon layer and a silicon dioxide layer successively laminated on a silicon substrate and preparing a second Si substrate having a silicon surface;

treating said silicon surface of said second Si substrate to form a hydrophobic silicon surface;

placing said first substrate upon said second Si substrate to bring a surface of said silicon dioxide layer and said hydrophobic silicon surface into contact;

heat treating said contacted first and second substrates at a temperature of not lower than 900° C. to bond said first and second substrates; and removing said silicon substrate and said porous silicon layer of said first substrate to leave said single crystal silicon layer and said silicon dioxide layer of said first substrate on said second Si substrate, thereby providing said SOI substrate.

9. The method for the production of an SOI substrate according to claim 8, wherein said silicon substrate is removed by grinding.

10. The method for the production of an SOI substrate according to claim 8, wherein said silicon substrate is removed by etching with an alkaline solution.

11. The method for the production of an SOI substrate according to claim 8, wherein said porous silicon layer is removed by etching with a solution containing hydrofluoric acid or with an alkaline solution.

12. The method for the production of an SOI substrate according to claim 8, comprising treating said silicon surface of said second substrate with a solution containing hydrofluoric acid to form said hydrophobic silicon surface.

13. The method for the production of an SOI substrate according to claim 12, wherein a hydrofluoric acid concentration in said solution is 1.5%.

14. The method for the production of an SOI substrate according to claim 8, wherein said hydrophobic silicon surface of said second substrate has a water content of not more than $6 \times 10^{13}$ molecules/cm$^2$.

15. The method for the production of an SOI substrate according to claim 8, wherein said heat treatment is conducted at a temperature of about 900° C. to about 1100° C.

16. A method for the production of an SOI substrate comprising the steps of:

preparing a first substrate comprising a silicon substrate having a silicon dioxide layer formed on a surface of said silicon substrate and preparing a second substrate having a porous silicon layer and a single crystal silicon layer successively laminated on a silicon substrate;

treating a surface of said single crystal silicon layer of said second substrate to form a hydrophobic surface;

placing said first substrate upon said second substrate to bring a surface of said silicon dioxide layer and said hydrophobic surface of said single crystal silicon layer into contact;

heat treating said first and second substrates at a temperature of not lower than 900° C. to bond said first and second substrates; and removing said silicon substrate and said porous silicon layer from said second substrate to leave said single crystal silicon on said silicon dioxide layer of said first substrate, thereby providing said SOI substrate.

17. The method for the production of an SOI substrate according to claim 16, comprising treating said surface of said single crystal silicon layer of said second substrate with a solution containing hydrofluoric acid to form said hydrophobic surface.

18. The method for the production of an SOI substrate according to claim 17, wherein a hydrofluoric acid concentration in said solution is 1.5%.

19. The method for the production of an SOI substrate according to claim 16, wherein said hydrophobic surface of said single crystal silicon layer of said second substrate has a water content of not more than $6 \times 10^{13}$ molecules/cm$^2$.

20. The method for the production of an SOI substrate according to claim 16, wherein said heat treatment is conducted at a temperature of about 900° C. to about 1100° C.

21. An SOI substrate produced by a method according to any of claims 1, 8 or 16.

22. A method for the production of an SOI substrate comprising the steps of:

preparing a first Si substrate having a silicon dioxide surface and a second Si substrate having a silicon surface;

treating said silicon surface of said second Si substrate to form a hydrophobic silicon surface;

placing said first Si substrate upon said second Si substrate to bring said silicon dioxide surface and said hydrophobic silicon surface into contact;

heat treating said contacted first and second Si substrates at a temperature of not lower than 900° C. to bond said first and second Si substrates to each other; and removing a part of said first Si substrate to leave said silicon dioxide sandwiched between a remainder of said first Si substrate and said second substrate bonded thereto, thereby providing said SOI substrate wherein the remainder of said first Si substrate is located within 2 mm of a peripheral edge of said SOI substrate and wherein locally distributed large voids are absent from a peripheral part thereof.

23. The method according to claim 22, wherein each of said locally distributed large voids has a diameter of several mm.

24. The method according to claim 22, wherein said peripheral part is a region of said SOI substrate extending from 5 mm inside said peripheral edge to said peripheral edge.

25. The method for the production of an SOI substrate according to any one of claims 22 to 24, wherein said hydrophobic silicon surface of said second substrate has a water content of not more than $6 \times 10^{13}$ molecules/cm$^2$.

26. A method for the production of an SOI substrate comprising the steps of:

preparing a first Si substrate having a porous silicon layer, a single crystal silicon layer and a silicon dioxide layer successively laminated on a silicon substrate and preparing a second Si substrate having a silicon surface;

treating said silicon surface of said second Si substrate to form a hydrophobic silicon surface;

placing said first Si substrate upon said second Si substrate to bring a surface of said silicon dioxide layer and said hydrophobic silicon surface into contact;

heat treating said contacted first and second substrates at a temperature of not lower than 900° C. to bond said first and second substrates; and removing said silicon substrate and said porous silicon layer of said first substrate to leave said single crystal silicon layer and said silicon dioxide layer of said first substrate on said second Si substrate, thereby providing said SOI substrate wherein said single crystal silicon is located within 2 mm of a peripheral edge of said SOI substrate and wherein locally distributed large voids are absent from a periphral part thereof.

27. The method according to claim 26, wherein each of said locally distributed large voids has a diameter of several mm.

28. The method according to claim 26, wherein said peripheral part of said SOI substrate is a region extending from 5 mm inside said peripheral edge to said peripheral edge.

29. The method for the production of an SOI substrate according to any one of claims 26 to 28, wherein said hydrophobic silicon surface of said second substrate has a water content of not more than $6 \times 10^{13}$.

30. A method for the production of an SOI substrate comprising the step of:

preparing a first substrate comprising a silicon substrate, having a silicon dioxide layer formed on a surface of said silicon substrate and preparing a second substrate having a porous silicon layer and a single crystal silicon layer sucessively laminated on a silicon substrate;

treating a surface of said single crystal silicon layer of said second substrate to form a hydrophobic surface;

placing said first substrate upon said second substrate to bring a surface of said silicon dioxide layer and said hydrophobic surface of said single crystal silicon layer into contact;

heat treating said first and second substrates at a temperature of not lower than 900° C. to bond said first and second substrates; and removing said silicon substrate and said porous silicon layer from said second substrate to leave said single crystal silicon on said silicon dioxide layer of said first substrate, thereby providing said SOI substrate wherein said single crystal silicon is located within 2 mm of a peripheral edge of said SOI substrate and wherein locally distributed large voids are absent from a peripheral part thereof.

31. The method according to claim 30, wherein each of said locally distributed large voids has a diameter of several mm.

32. A method according to claim 30, wherein said peripheral part of said SOI substrate is a region extending from 5 mm inside said peripheral edge to said peripheral edge.

33. The method for the production of an SOI substrate according to any one of claims 30 to 32, wherein said hydrophobic silicon surface of said second substrate has a water content of not more than $6 \times 10^{13}$ molecules/cm$^2$.

34. The method according to claim 1, wherein locally distributed large voids are absent from a peripheral part of said SOI substrate.

35. The method according to claim 34, wherein each of said locally distributed large voids has a diameter of several mm.

36. The method according to claim 34, wherein said peripheral part of said SOI substrate is a region extending from 5 mm inside of said peripheral edge to said peripheral edge.

37. The method according to claim 1, wherein said remainder of said first or said second Si substrate is located with 2 mm of a peripheral edge of said SOI substrate.

38. The method for the production of an SOI substrate according to any one of claims 34 to 37, wherein said hydrophobic silicon surface of said second substrate has a water content of not more than $6 \times 10^{13}$ molecules/cm$^2$.

39. The method according to claim 8, wherein locally distributed large voids are absent from a peripheral part of said SOI substrate.

40. The method according to claim 8, wherein each of said locally distributed large voids has a diameter of several mm.

41. The method according to claim 39, wherein said peripheral part of said SOI substrate is a region extending from 5 mm inside said peripheral edge to said peripheral edge.

42. The method according to claim 8, wherein said single crystal silicon is located within 2 mm of a peripheral edge of said SOI substrate.

43. The method for the producton of an SOI substrate according to any one of claims 39 to 42 wherein said hydrophobic silicon surface of said second substrate has a water content of not more than $6 \times 10^{13}$ molecules/cm$^2$.

44. The method according to claim 16, wherein locally distributed large voids are absent from a peripheral part of said SOI substrate.

45. The method according to claim 44, wherein each of said locally distributed large voids has a diameter of several mm.

46. The method according to claim 44, wherein said peripheral part is a region extending from 5 mm inside said peripheral edge to said peripheral edge.

47. The method according to claim 16, wherein said single cyrstal silicon is located within 2 mm of a peripheral edge of said SOI substrate.

48. The method for the production of an SOI substrate according to any one of claims 44 to 47, wherein said hydrophobic silicon surface of said second substrate has a water content of not more than $6 \times 10^{13}$ molecules/cm$^2$.

* * * * *

UNITED STATES PATENT AND TRADEMARK OFFICE
CERTIFICATE OF CORRECTION

PATENT NO.   : 6,156,624
DATED        : December 5, 2000
INVENTOR(S)  : Kenji Yamagata et al.

It is certified that error appears in the above-identified patent and that said Letters Patent is hereby corrected as shown below:

Column 1,
Line 8, "of" should be deleted.

Column 2,
Line 64, "event" should read -- even --.

Column 3,
Line 19, "the" should be deleted;
Line 49, "by" should read -- by the --; and
Line 67, "pasted" should read -- pasted substrates. --.

Column 5,
Line 21, "the" should be deleted; and
Line 52, "substrate" should read -- substrate, --.

Column 7,
Line 6, "together" should read -- together, --.

Column 9,
Line 33, "hydrof-" should read -- hydro- --;
Line 34, "luoric" should read -- fluoric --; and
Line 49, "substrate" should read -- substrates --.

Column 10,
Line 15, "substrate" should read -- substrates --.

Column 15,
Line 19, "$6 \times 10^{13}$." should read -- $6 \times 10^{13}$ molecules/cm$^2$. --;
Line 22, "substrate," should read -- substrate --; and
Line 48, "A" should read -- The --.

UNITED STATES PATENT AND TRADEMARK OFFICE
CERTIFICATE OF CORRECTION

PATENT NO. : 6,156,624
DATED : December 5, 2000
INVENTOR(S) : Kenji Yamagata et al.

It is certified that error appears in the above-identified patent and that said Letters Patent is hereby corrected as shown below:

<u>Column 16,</u>
Line 32, "39 to 42" should read -- 39 to 42, --.

Signed and Sealed this

Thirteenth Day of November, 2001

Attest:

*Nicholas P. Godici*

NICHOLAS P. GODICI
*Attesting Officer*      *Acting Director of the United States Patent and Trademark Office*